US011706985B2

(12) United States Patent
Adachi et al.

(10) Patent No.: US 11,706,985 B2
(45) Date of Patent: Jul. 18, 2023

(54) THERMOELECTRIC CONVERSION ELEMENT

(71) Applicants: Sumitomo Electric Industries, Ltd., Osaka (JP); Toyota School Foundation, Nagoya (JP)

(72) Inventors: Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 4 days.

(21) Appl. No.: 17/635,379

(22) PCT Filed: Jun. 24, 2020

(86) PCT No.: PCT/JP2020/024772
§ 371 (c)(1),
(2) Date: Feb. 15, 2022

(87) PCT Pub. No.: WO2021/039074
PCT Pub. Date: Mar. 4, 2021

(65) Prior Publication Data

US 2022/0399485 A1 Dec. 15, 2022

(30) Foreign Application Priority Data

Aug. 30, 2019 (JP) ................................ 2019-158547

(51) Int. Cl.
*H10N 10/852* (2023.01)
*H10N 10/17* (2023.01)
(Continued)

(52) U.S. Cl.
CPC ......... *H10N 10/852* (2023.02); *C01B 19/007* (2013.01); *C01G 3/12* (2013.01); *H10N 10/17* (2023.02); *H10N 10/857* (2023.02)

(58) Field of Classification Search
CPC ........................... H10N 10/852; H10N 10/857
See application file for complete search history.

(56) References Cited

U.S. PATENT DOCUMENTS 3,256,696 A * 6/1966 Henderson .......... C22C 32/0068 252/62.3 GA
3,853,632 A * 12/1974 Hampl, Jr. ........... H10N 10/854 136/238

(Continued)

FOREIGN PATENT DOCUMENTS

EP 2924747 A1 * 9/2015 ............. C01B 19/00
JP 2016-534562 A 11/2016

OTHER PUBLICATIONS

He et al., "High Thermoelectric Performance in Non-Toxic Earth—Abundant Copper Sulfide", Advanced Materials, 2014, vol. 26, pp. 3974-3978.

(Continued)

*Primary Examiner* — Golam Mowla
(74) *Attorney, Agent, or Firm* — Xsensus LLP

(57) ABSTRACT

A thermoelectric conversion element includes a thermoelectric conversion material portion having a compound semiconductor composed of first base material element A and second base material element B and represented by $A_{x-c}B_y$ with value of x being smaller by c with respect to a compound $A_xB_y$ according to a stoichiometric ratio, a first electrode disposed in contact with the thermoelectric conversion material portion, and a second electrode disposed in contact with the thermoelectric conversion material portion and apart from the first electrode. An A-B phase diagram includes a first region corresponding to low temperature
(Continued)

phase, second region corresponding to high temperature phase, and third region corresponding to coexisting phase, sandwiched between the low temperature phase and the high temperature phase, in which the low and high temperature phases coexist. A temperature at a boundary between the first region and the third region changes monotonically with a change in c.

6 Claims, 9 Drawing Sheets

(51) Int. Cl.

| | |
|---|---|
| ***H10N 10/857*** | (2023.01) |
| ***C01B 19/00*** | (2006.01) |
| ***C01G 3/12*** | (2006.01) |

(56) References Cited

U.S. PATENT DOCUMENTS

2004/0103936 A1* 6/2004 Andriessen ......... H01L 31/0324 136/265
2016/0172568 A1 6/2016 Ko et al.
2016/0181497 A1* 6/2016 Ko ......................... H10N 10/01 252/519.4
2016/0257567 A1* 9/2016 Hsiang .................. C01B 19/007
2020/0152849 A1* 5/2020 He ......................... H10N 10/17
2021/0020427 A1* 1/2021 Rozen ............... H01L 21/02181

OTHER PUBLICATIONS

Byeon et al., "Discovery of Colossal Seebeck Effect in Metallic Cu2Se", Nature Communications, 2019, vol. 10, Article No. 72, 7 pages.
Byeon et al., "Dynamical Variation of Carrier Concentration and Colossal Seebeck Effect in Cu2S Low-Temperature Phase", Journal of Alloys and Compounds, 2020, vol. 826, 6 pages.
Liu et al., "Ultrahigh Thermoelectric Performance by Electron and Phonon Critical Scattering in Cu2Se1-xlx", Advanced Materials, 2013, vol. 25, pp. 6607-6612.
Zhong et al., "High Superionic Conduction Arising from Aligned Large Lamellae and Large Figure of Merit in Bulk Cu1.94Al0.02Se", Applied Physics Letters, 2014, vol. 105, 5 pages.

* cited by examiner

THERMOELECTRIC CONVERSION ELEMENT

CROSS-REFERENCE TO RELATED APPLICATIONS

The present application is based on PCT filing PCT/JP2020/024772, filed Jun. 24, 2020, and claims priority to Japanese Application No. 2019-158547, filed Aug. 30, 2019, the entire contents of each are incorporated herein by reference.

TECHNICAL FIELD

The present disclosure relates to a thermoelectric conversion element.

BACKGROUND ART

In recent years, renewable energy has been drawing attention as clean energy to replace fossil fuels such as petroleum. Renewable energy includes energy obtained through power generation using solar light, hydraulic power, and wind power, as well as energy obtained through power generation by thermoelectric conversion using a temperature difference. In the thermoelectric conversion, heat is directly converted into electricity, so no extra waste is discharged during the conversion. A power generation device utilizing the thermoelectric conversion requires no motor or other drive unit, offering advantages such as easy maintenance of the device.

Efficiency η in converting a temperature difference (heat energy) into electric energy using a material (thermoelectric conversion material) for thermoelectric conversion is given by the following expression (1).

$$\eta=\Delta T/T_h\cdot(M-1)/(M+T_c/T_h) \quad (1)$$

Here, η represents a conversion efficiency, ΔT represents a difference between $T_h$ and $T_c$, $T_h$ represents a temperature on the high temperature side, $T_c$ represents a temperature on the low temperature side, M equals to $(1+ZT)^{1/2}$, $ZT=\alpha^2 ST/\kappa$, ZT represents a dimensionless figure of merit, α represents a Seebeck coefficient, S represents an electrical conductivity, T represents a temperature, and κ represents a thermal conductivity. The conversion efficiency is a monotonically increasing function of ZT. It is important to increase ZT in developing a thermoelectric conversion material.

A technique using $Cu_2Se_{1-x}I_x$ as a thermoelectric material has been reported (e.g., Non Patent Literature 1). A technique using $Cu_{1.94}Al_{0.02}Se$ as a thermoelectric material has also been reported (e.g., Non Patent Literature 2).

CITATION LIST

Non Patent Literature

Non Patent Literature 1: Huili Liu et al., "Ultrahigh Thermoelectric Performance by Electron and Phonon Critical Scattering in $Cu_2Se_{1-x}I_x$", Advanced Materials 2013, 25, 6607-6612

Non Patent Literature 2: Bin Zhong et al., "High superionic conduction arising from aligned large lamellae and large figure of merit in ulk $Cu_{1.94}Al_{0.02}Se$", Applied Physics Letters 105, 123902 (2014)

SUMMARY OF INVENTION

A thermoelectric conversion element according to the present disclosure is a thermoelectric conversion element converting heat into electricity, which includes a thermoelectric conversion material portion constituted of a compound semiconductor that is composed of a first base material element A and a second base material element B and is represented by $A_{x-c}B_y$ with a value of x being smaller by c with respect to a compound $A_xB_y$ according to a stoichiometric ratio, a first electrode disposed in contact with the thermoelectric conversion material portion, and a second electrode disposed in contact with the thermoelectric conversion material portion and apart from the first electrode. An A-B phase diagram includes a first region corresponding to a low temperature phase, a second region corresponding to a high temperature phase, and a third region corresponding to a coexisting phase, sandwiched between the low temperature phase and the high temperature phase, in which the low and high temperature phases coexist. A temperature at a boundary between the first region and the third region changes monotonically with a change in c.

DESCRIPTION OF EMBODIMENTS

Figure 1:
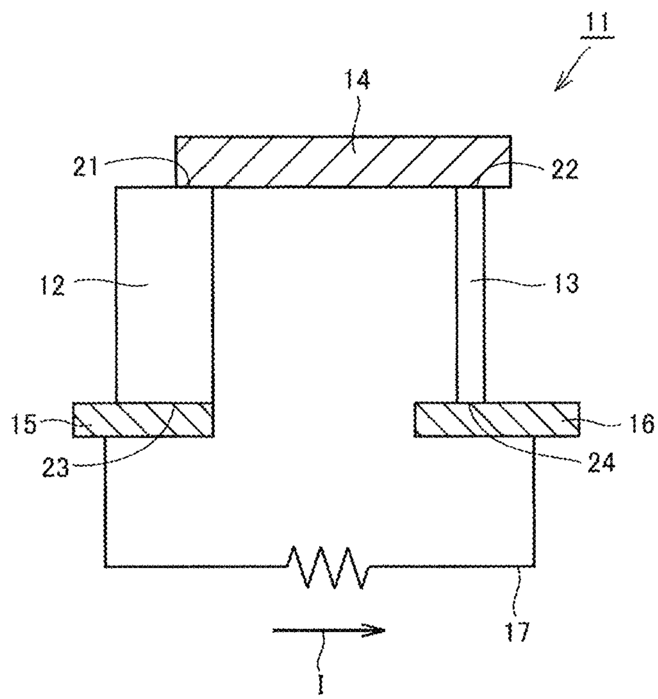
FIG. 1 is a schematic cross-sectional view showing the structure of a thermoelectric conversion element according to Embodiment 1.

Problems to be Solved by the Present Disclosure

In a thermoelectric conversion element, if the conductivity type of a compound semiconductor constituting the thermoelectric conversion material can be changed during the use, the thermoelectric conversion element can be used for a temperature sensor and the like, leading to effective utilization. In other words, there is a need for a thermoelectric conversion element that allows the compound semiconductor constituting the thermoelectric conversion material to be changed in its conductivity type.

Thus, one of the objects is to provide a thermoelectric conversion element that allows the conductivity type of a compound semiconductor constituting the thermoelectric conversion material to be changed.

Advantageous Effects of the Present Disclosure

According to the thermoelectric conversion element described above, the conductive type of the compound semiconductor constituting the thermoelectric conversion material can be changed.

DESCRIPTION OF EMBODIMENTS OF THE PRESENT DISCLOSURE

Firstly, embodiments of the present disclosure will be listed and described. A thermoelectric conversion element according to the present disclosure is a thermoelectric conversion element converting heat into electricity, which includes a thermoelectric conversion material portion constituted of a compound semiconductor that is composed of a first base material element A and a second base material element B and is represented by $A_{x-c}B_y$ with a value of x being smaller by c with respect to a compound $A_xB_y$ according to a stoichiometric ratio, a first electrode disposed in contact with the thermoelectric conversion material portion, and a second electrode disposed in contact with the thermoelectric conversion material portion and apart from the first electrode. An A-B phase diagram includes a first region corresponding to a low temperature phase, a second region corresponding to a high temperature phase, and a third region corresponding to a coexisting phase, sandwiched between the low temperature phase and the high temperature phase, in which the low and high temperature phases coexist. A temperature at a boundary between the first region and the third region changes monotonically with a change in c.

For the thermoelectric conversion material portion constituted of a compound semiconductor represented by $A_{x-c}B_y$, the present inventors focused on the temperature at the boundary between the first region corresponding to the low temperature phase and the third region corresponding to the coexisting phase in the A-B phase diagram. The inventors found that the use of the above-described thermoelectric conversion element in a temperature range in which the temperature at the boundary changes monotonically with a change in c brings about a change of the conductivity type of the compound semiconductor constituting the thermoelectric conversion material portion. Through diligent studies, the inventors have reached the construction of the thermoelectric conversion element of the present disclosure by utilizing the fact that the conductivity type of the compound semiconductor constituting the thermoelectric conversion material portion changes in the above-described temperature range. That is, according to the thermoelectric conversion element of the present disclosure, during its use in a temperature range in which the temperature at the boundary changes, the conductivity type of the compound semiconductor constituting the thermoelectric conversion material portion can be changed depending on the temperature range in which the element is used.

The reason for such thermoelectric performance can be considered, for example, as follows. For a thermoelectric conversion material portion constituted of a compound semiconductor represented by $A_{x-c}B_y$, it is considered that during a temperature change, for example a temperature rise, in the above-described temperature range, crystals differing in composition from $A_{x-c}B_y$ are generated, causing the compound semiconductor to function as one conductivity type, e.g., n type. With a further temperature rise, in the portion of the material other than the crystals of different compositions, the content ratio of one of the base material elements becomes higher, allowing the compound semiconductor to function as a thermoelectric conversion material having a stronger tendency toward the one conductivity type. Thereafter, with a still further temperature rise, the material reaches a high temperature phase of the compound semiconductor represented by $A_{x-c}B_y$, and as a result, the compound semiconductor conceivably functions as the other conductivity type, e.g., p type. It is therefore considered that the thermoelectric conversion element of the present disclosure, when used in the above-described temperature range, allows the conductivity type of the compound semiconductor constituting the thermoelectric conversion material portion to be changed.

In the thermoelectric conversion element described above, the compound semiconductor may be a chalcogen compound. The chalcogen compound has a relatively low thermal conductivity. The conversion efficiency is a monotonically increasing function of ZT, as explained above, so ZT can be increased with a low thermal conductivity. Therefore, such a thermoelectric conversion element can improve the thermoelectric conversion efficiency.

In the thermoelectric conversion element described above, the first base material element may be Cu. The second base material element may be S. The compound $A_xB_y$ according to the stoichiometric ratio may be $Cu_2S$. The value of c may be greater than 0 and smaller than 0.01. Such a thermoelectric conversion element can more reliably allow the conductivity type of the compound semiconductor constituting the thermoelectric conversion material portion to be changed.

In the thermoelectric conversion element described above, the first base material element may be Cu. The second base material element may be Se. The compound $A_xB_y$ according to the stoichiometric ratio may be $Cu_2Se$. The value of c may be greater than 0 and smaller than 0.143. Such a thermoelectric conversion element can more reliably allow the conductivity type of the compound semiconductor constituting the thermoelectric conversion material portion to be changed.

In the thermoelectric conversion element described above, the first base material element may be Ag. The second base material element may be S. The compound $A_xB_y$ according to the stoichiometric ratio may be $Ag_2S$. The value of c may be greater than 0 and smaller than 0.002. Such a thermoelectric conversion element can more reliably allow the conductivity type of the compound semiconductor constituting the thermoelectric conversion material portion to be changed.

In the thermoelectric conversion element described above, the first base material element may be Cu. The second base material element may be Te. The compound $A_xB_y$ according to the stoichiometric ratio may be $Cu_2Te$. The value of c may be greater than 0.02 and smaller than 0.22. Such a thermoelectric conversion element can more reliably allow the conductivity type of the compound semiconductor constituting the thermoelectric conversion material portion to be changed.

DETAILS OF EMBODIMENTS OF THE PRESENT DISCLOSURE

Embodiments of the thermoelectric conversion element of the present disclosure will be described below with reference to the drawings. In the drawings referenced below, the same or corresponding parts are denoted by the same reference numerals and the descriptions thereof are not repeated.

Embodiment 1

An embodiment, Embodiment 1, of a thermoelectric conversion element according to the present disclosure will be described with reference to FIG. 1. FIG. 1 is a schematic cross-sectional view showing the structure of a thermoelectric conversion element according to Embodiment 1.

Referring to FIG. 1, the thermoelectric conversion element 11 according to Embodiment 1 of the present disclosure is a thermoelectric conversion element that converts heat into electricity, and is a so-called I type (unileg) thermoelectric conversion element 11. The I type thermoelectric conversion element 11 includes a thermoelectric conversion material portion 12, a metal wire 13, a high temperature side electrode 14, a first low temperature side electrode 15, a second low temperature side electrode 16, and a wire 17.

The thermoelectric conversion material portion 12 is constituted of a compound semiconductor that is composed of a first base material element A and a second base material element B and is represented by $A_{x-c}B_y$ with the value of x being smaller by c with respect to a compound $A_xB_y$ according to the stoichiometric ratio. The compound semiconductor constituting the thermoelectric conversion material portion 12 is a chalcogen compound. Such a chalcogen compound has a relatively low thermal conductivity. With the conversion efficiency being a monotonically increasing function of ZT as explained previously, ZT can be increased with a low thermal conductivity. Therefore, the thermoelectric conversion element 11 as described above can improve the thermoelectric conversion efficiency. The configuration of the thermoelectric conversion material portion 12 will be described in detail later.

The material of the metal wire 13 is, for example, Bi, constantan, or Al. The metal wire 13 only needs to be electrically conductive, although it is preferably low in thermal conductivity.

The thermoelectric conversion material portion 12 and the metal wire 13 are disposed side by side with a spacing therebetween. The high temperature side electrode 14 as the first electrode is disposed to extend from one end 21 of the thermoelectric conversion material portion 12 to one end 22 of the metal wire 13. The high temperature side electrode 14 is disposed so as to contact both the one end 21 of the thermoelectric conversion material portion 12 and the one end 22 of the metal wire 13. The high temperature side electrode 14 is disposed to connect the one end 21 of the thermoelectric conversion material portion 12 and the one end 22 of the metal wire 13. The high temperature side electrode 14 is composed of an electrically conductive material, such as a metal. The high temperature side electrode 14 is in ohmic contact with the thermoelectric conversion material portion 12 and the metal wire 13.

The first low temperature side electrode 15 as the second electrode is disposed in contact with another end 23 of the thermoelectric conversion material portion 12. The first low temperature side electrode 15 is disposed apart from the high temperature side electrode 14. The first low temperature side electrode 15 is composed of an electrically conductive material, such as a metal. The first low temperature side electrode 15 is in ohmic contact with the thermoelectric conversion material portion 12.

The second low temperature side electrode 16 also as the second electrode is disposed in contact with another end 24 of the metal wire 13. The second low temperature side electrode 16 is disposed apart from the high temperature side electrode 14 and the first low temperature side electrode 15. The second low temperature side electrode 16 is composed of an electrically conductive material, such as a metal. The second low temperature side electrode 16 is in ohmic contact with the metal wire 13.

The wire 17 is composed of an electric conductor such as a metal. The wire 17 electrically connects the first low temperature side electrode 15 and the second low temperature side electrode 16 via a load (resistance).

In the I type thermoelectric conversion element 11, when a temperature difference is formed so that the one end 21 side of the thermoelectric conversion material portion 12 and the one end 22 side of the metal wire 13 are at a high temperature and the other end 23 side of the thermoelectric conversion material portion 12 and the other end 24 side of the metal wire 13 are at a low temperature, for example, then in the thermoelectric conversion material portion 12, carriers (for example when it attains p type, holes) move from the one end 21 side toward the other end 23 side. At this time, in the metal wire 13, different type carriers (for example, electrons) move from the one end 22 side toward the other end 24 side. As a result, a current flows through the wire 17 in the direction of the arrow I. In this manner, the I type thermoelectric conversion element 11 is able to output electrical energy obtained by converting heat energy, or the temperature difference, by the thermoelectric conversion material portion 12 and the metal wire 13 using the high temperature side electrode 14 as the first electrode and the first and second low temperature side electrodes 15 and 16 as the second electrode. Further, when the conductive type of the compound semiconductor constituting the thermoelectric conversion material can be changed during the use, the current flowing through it will change, and accordingly, the electrical energy to be output will change. On the basis of this change, the I type thermoelectric conversion element 11 can be used, for example, for a temperature sensor or the like.

A description will now be made of the configuration of the above-described thermoelectric conversion material portion 12. As described above, the thermoelectric conversion material portion 12 is constituted of a compound semiconductor that is composed of a first base material element A and a second base material element B and is represented by $A_{x-c}B_y$ with respect to the compound $A_xB_y$ according to the stoichiometric ratio. Specifically, the first base material element A is Cu and the second base material element B is S. The thermoelectric conversion material portion 12 is constituted of the compound semiconductor represented by $Cu_{2-c}S$ with respect to the compound $Cu_2S$ according to the stoichiometric ratio, in this case $Cu_2S$ with the value of x being 2 and the value of y being 1. The value of c is greater than 0 and smaller than 0.01.

Such a thermoelectric conversion material portion 12 can be produced, for example, through the following producing method. Firstly, Cu powder and S powder are prepared. When the compound semiconductor constituting the thermoelectric conversion material portion 12 is represented by $Cu_{2-c}S$, the mixing ratios of Cu and S are adjusted such that the value of x is greater than 0 and smaller than 0.01 The powders are mixed, pressed, and solidified into a pellet form, thereby obtaining a green compact. Next, a portion of the obtained green compact in the pellet form is heated for crystallization.

The heating of a portion of the green compact is performed within a chamber having a heater such as a resistance heating wire, for example. The chamber has a reduced pressure. Specifically, the degree of vacuum in the chamber is set to be about 1×10−4 Pa, for example. The green compact is heated with the heater for about one second. When the change point is reached, a portion of the green compact is crystallized. The heating is stopped after the crystallization of the portion of the green compact. In this case, the crystallization is promoted by self-heating without the need of reheating. That is, the remaining portion of the green compact is crystallized by the self-heating of the green compact with the progress of crystallization. Thereafter, the material is once melted in a high frequency furnace, and then crystals are produced. The compound semiconductor constituting the thermoelectric conversion material portion 12 included in the thermoelectric conversion element 11 in Embodiment 1 is thus obtained.

Figure 2:
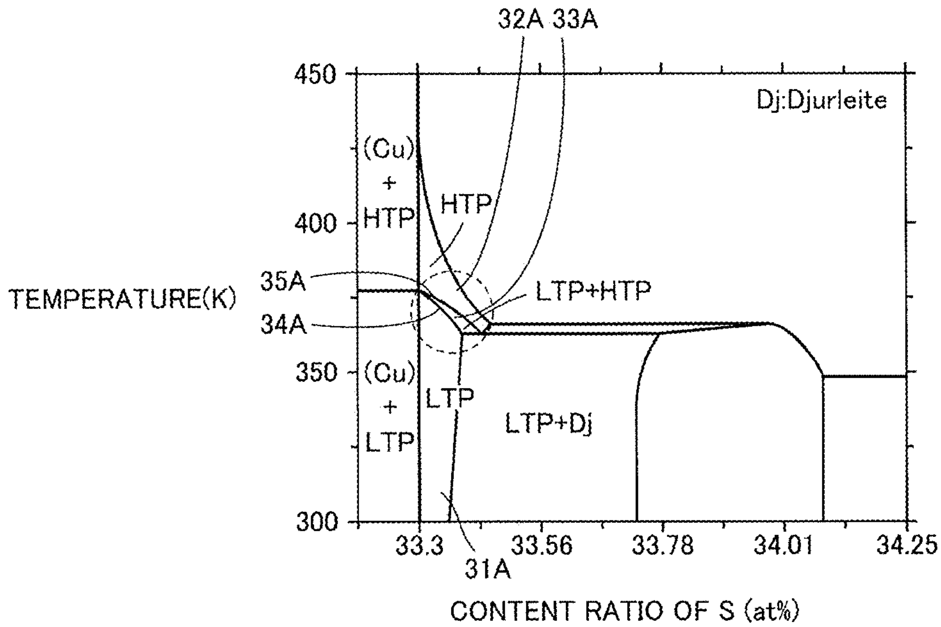
FIG. 2 shows a portion of a Cu—S phase diagram.

Next, a composition ratio relationship between the first base material element Cu and the second base material element S will be described. FIG. 2 shows a portion of a Cu—S phase diagram. In FIG. 2, the horizontal axis represents content ratio of S (at %) and the vertical axis represents temperature (K). FIG. 2 is an enlarged view of the range of the content ratio of S from around 33.33 at % to around 34.25 at %.

Referring to FIG. 2, the Cu—S phase diagram shows, in the range of the content ratio of S from 33.33 at % to 34.25 at %, a low temperature phase (LTP), a high temperature phase (HTP), and a coexisting phase (LTP+HTP), sandwiched between the low temperature phase and the high temperature phase, in which the low and high temperature phases coexist. In other words, the Cu—S phase diagram includes a first region 31A corresponding to the low temperature phase, a second region 32A corresponding to the high temperature phase, and a third region 33A corresponding to the coexisting phase, sandwiched between the low temperature phase and the high temperature phase, in which the low and high temperature phases coexist. As shown in FIG. 2, a boundary 34A between the first region 31A and the third region 33A is inclined. In the present embodiment, the temperature at the boundary 34A between the first region 31A and the third region 33A changes monotonically with a change in c. Specifically, as c becomes greater, i.e., as the content ratio of S becomes smaller, the temperature at the boundary 34A becomes higher. A boundary 35A between the second region 32A and the third region 33A is also inclined.

Here, the I type thermoelectric conversion element 11 in Embodiment 1 is used in a temperature range in which the temperature at the boundary 34A changes. Specifically, the element is used in the temperature range in which the temperature at the boundary 34A changes with the change in c.

Figure 3:
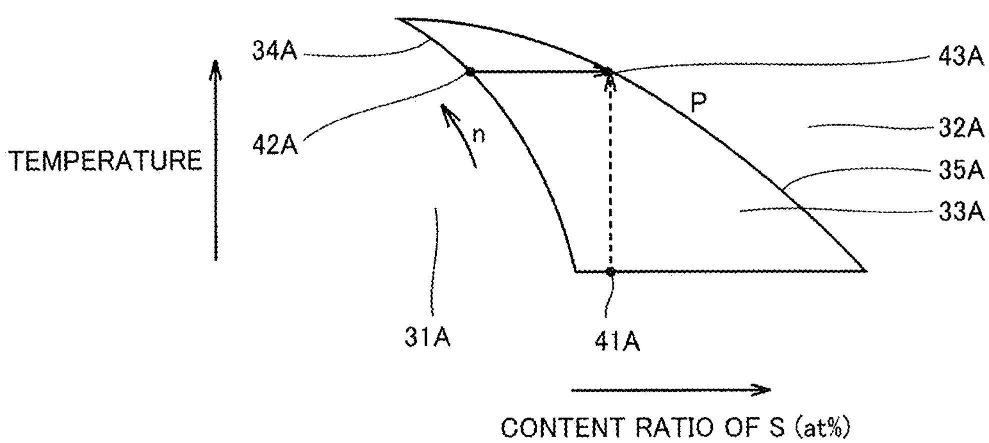
FIG. 3 is an enlarged schematic view of a portion of the Cu—S phase diagram in which a third region corresponding to a coexisting phase is located.

FIG. 3 is an enlarged schematic view of a portion of the Cu—S phase diagram in which the third region 33A corresponding to the coexisting phase is located. FIG. 3 is an enlarged view of the region delimited by the dashed line in FIG. 2. The states of the Cu—S compound semiconductor will be described with reference to FIG. 3. In the compound semiconductor represented by $Cu_{2-c}S$, when the temperature of the compound semiconductor with a composition of a certain value of c, indicated by the point 41A, is increased, crystals of different compositions are generated along the boundary 34A. Here, the compound semiconductor constituting the thermoelectric conversion material portion 12 has n type. Thereafter, as the temperature rises, the composition changes along the boundary 34A, and the concentration of the n type compound semiconductor increases. That is, in the compound semiconductor constituting the thermoelectric conversion material portion 12, the composition shifts so that the content ratio of Cu increases. When the temperature becomes even higher, the composition shifts from the position of point 42A on the boundary 34A to the position of point 43A on the boundary 35A, thereby attaining a state of high temperature phase. In the state of the high temperature phase, the compound semiconductor constituting the thermoelectric conversion material portion 12 becomes p type. In this manner, the conductive type of the compound semiconductor constituting the thermoelectric conversion material portion 12 changes from the n type to the p type in the above-described temperature range.

Figure 4:
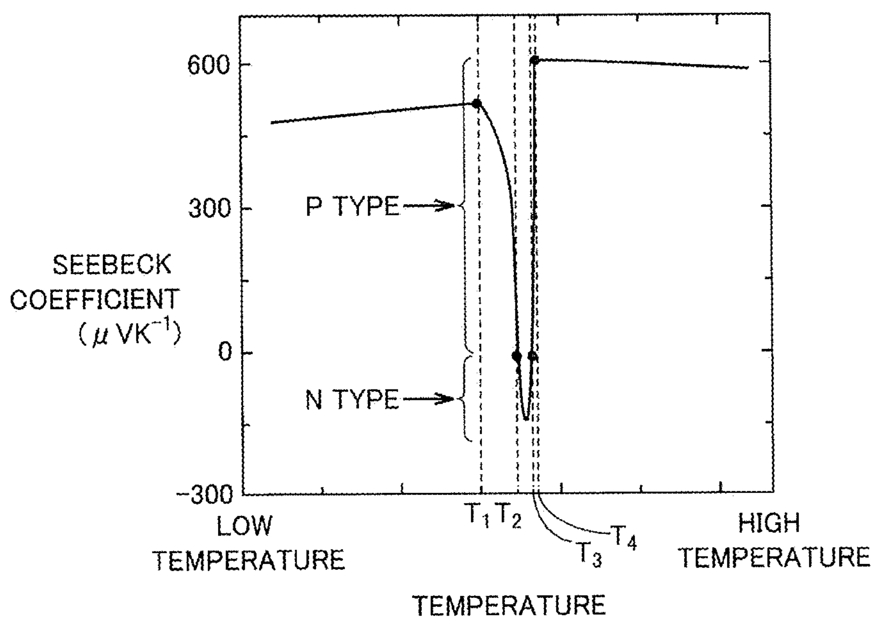
FIG. 4 is a graph showing a relationship between Seebeck coefficient α and temperature of a thermoelectric conversion material portion included in the thermoelectric conversion element in Embodiment 1.

FIG. 4 is a graph showing a relationship between Seebeck coefficient α and temperature of the thermoelectric conversion material portion 12 included in the thermoelectric conversion element 11 in Embodiment 1. In FIG. 4, the horizontal axis represents temperature and the vertical axis represents Seebeck coefficient ($\mu VK^{-1}$). For the temperature on the horizontal axis, the temperature is low on the left side and high on the right side.

Referring to FIG. 4, as the thermoelectric conversion material portion 12 represented by $Cu_{2-c}S$ is increased in temperature, the Seebeck coefficient takes a value of about 450 ($\mu VK^{-1}$). When a certain temperature $T_1$ is reached, the Seebeck coefficient rapidly decreases, and when a temperature $T_2$ is reached, the Seebeck coefficient changes from a positive value to a negative value significantly. The change of the Seebeck coefficient is specifically from about +450 ($\mu VK^{-1}$) to about −150 ($\mu VK^{-1}$). Thereafter, as the temperature rises, the Seebeck coefficient again increases and turns from a negative value to a positive value at temperature $T_3$. Thereafter, the Seebeck coefficient increases rapidly with a further temperature rise, and reaches about +600 ($\mu VK^{-1}$) at temperature $T_4$.

At the temperature at which the Seebeck coefficient changes from a positive value to a negative value, and at the temperature at which the Seebeck coefficient changes from a negative value to a positive value, the compound semiconductor constituting the thermoelectric conversion material portion 12 undergoes changes in conductivity type. Thus, the thermoelectric conversion element 11 described above is a thermoelectric conversion element that, when being used in a temperature range in which the temperature at the boundary changes, allows the conductivity type of the compound semiconductor constituting the thermoelectric conversion material portion 12 to be changed depending on the temperature range in which the element is used.

In the thermoelectric conversion element 11 in Embodiment 1, the value of c is greater than 0 and smaller than 0.01. That is, there is a relationship of $0<c<0.01$ for the value of c described above. Specifically, a compound semiconductor having the ratio of the base material elements in the range of $Cu_{66.66}S_{33.34}$ to $Cu_{66.67}S_{33.33}$ is adopted. Such a thermoelectric conversion element 11 can more reliably allow the conductivity type of the compound semiconductor constituting the thermoelectric conversion material portion to be changed. That is, with such a configuration, the thermoelectric conversion element described above can be obtained more reliably.

Embodiment 2

Another embodiment, Embodiment 2, will now be described. The thermoelectric conversion element in Embodiment 2 differs from that of Embodiment 1 in that Se is selected as the second base material element B in the thermoelectric conversion material portion. In the thermoelectric conversion element in Embodiment 2, the first base material element is Cu. The second base material element is Se. The compound $A_xB_y$ according to the stoichiometric ratio is $Cu_2Se$. The value of c is greater than 0 and smaller than 0.143.

Figure 5:
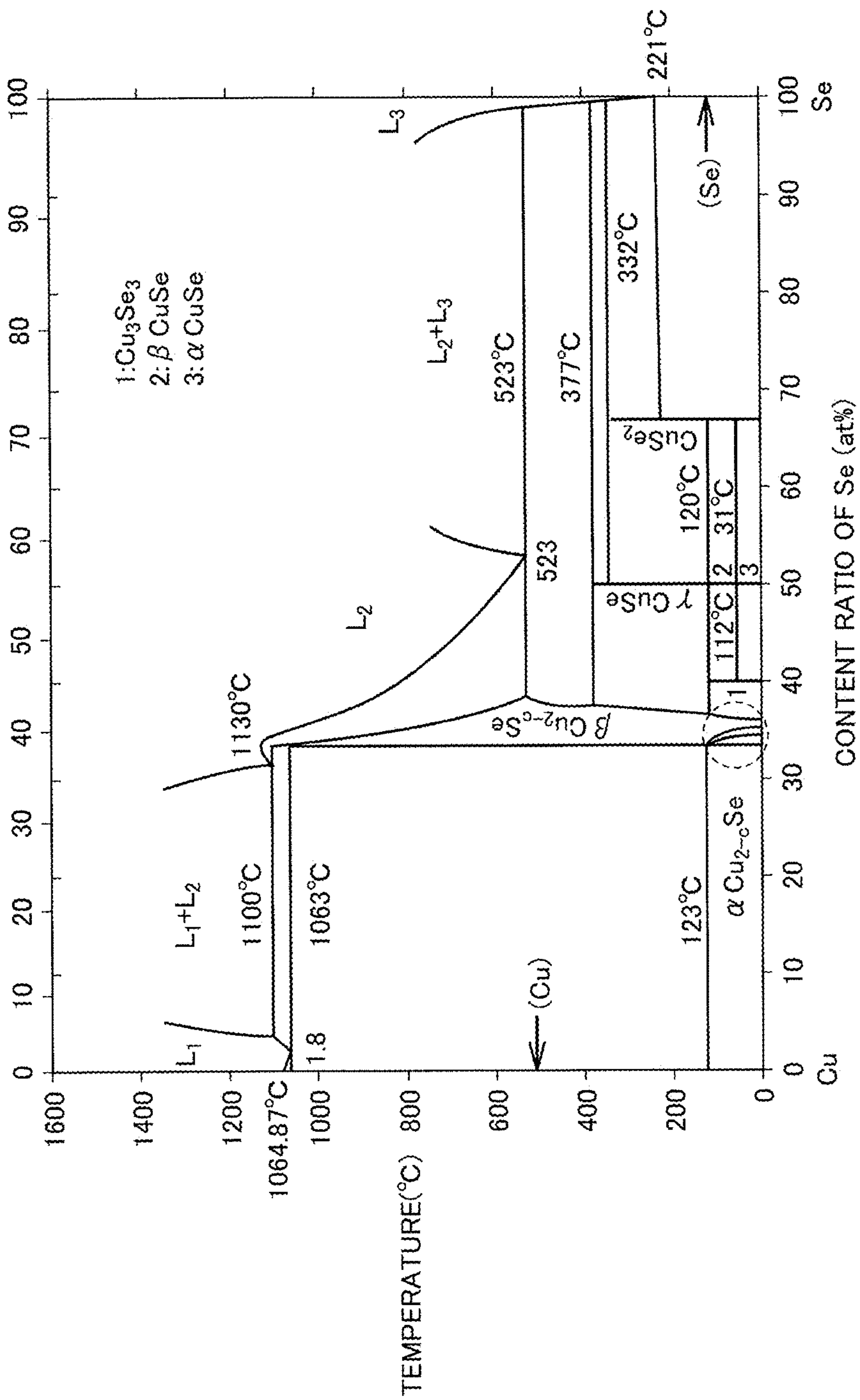
FIG. 5 is a Cu—Se phase diagram.
Figure 6:
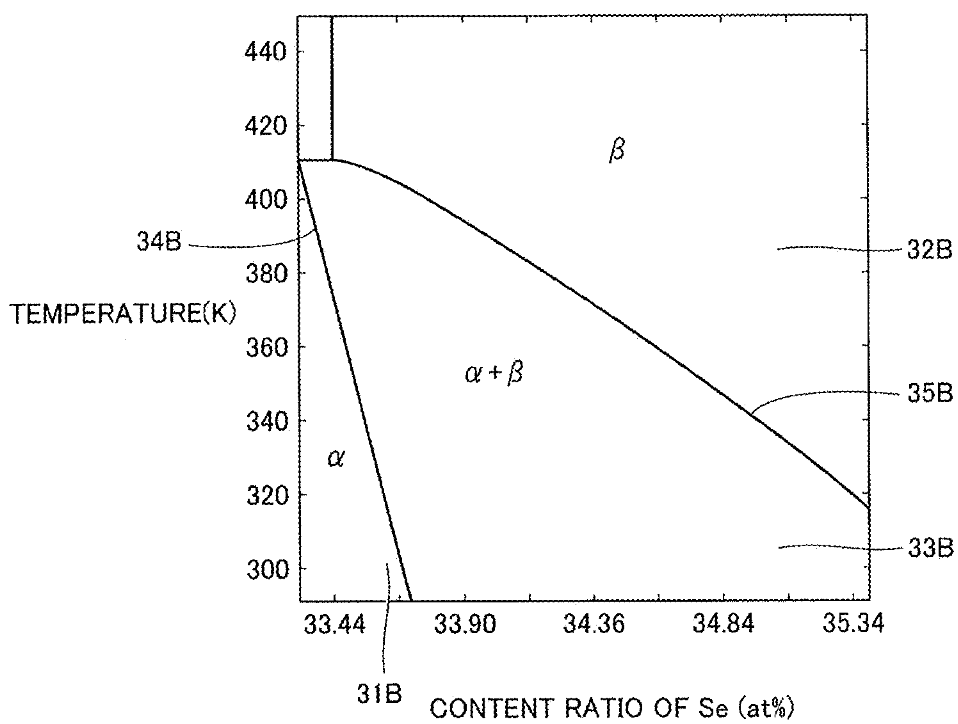
FIG. 6 is an enlarged view of the region delimited by the dashed line in FIG. 5.

FIG. 5 is a Cu—Se phase diagram. FIG. 6 shows, in an enlarged view, a portion of the Cu—Se phase diagram. FIG. 6 is an enlarged view of the region delimited by the dashed line in FIG. 5. In FIG. 5, the horizontal axis represents content ratio of Se (at %) and the vertical axis represents temperature (° C.). In FIG. 6, the horizontal axis represents content ratio of Se (at %) and the vertical axis represents temperature (K).

Referring to FIGS. 5 and 6, for the compound semiconductor constituting the thermoelectric conversion material portion included in the thermoelectric conversion element in Embodiment 2, a low temperature phase, a high temperature phase, and a coexisting phase are shown in the Cu—Se phase diagram. That is, the Cu—Se phase diagram includes a first region 31B corresponding to the low temperature phase, a second region 32B corresponding to the high temperature phase, and a third region 33B corresponding to the coexisting phase, sandwiched between the low temperature phase and the high temperature phase, in which the low and high temperature phases coexist (see particularly FIG. 6). As shown in FIGS. 5 and 6, a boundary 34B between the first region 31B and the third region 33B is inclined. In the present embodiment, the temperature at the boundary 34B between the first region 31B and the third region 33B changes monotonically with the change in c, as in the case of Embodiment 1 described above. Specifically, as c becomes greater, i.e., as the content ratio of Se becomes smaller, the temperature at the boundary 34B becomes higher. A boundary 35B between the second region 32B and the third region 33B is also inclined.

Here, the I type thermoelectric conversion element shown in Embodiment 2 is used in a temperature range in which the temperature at the boundary 34B changes. Specifically, the element is used in the temperature range in which the temperature at the boundary 34B changes with the change in c.

Figure 7:
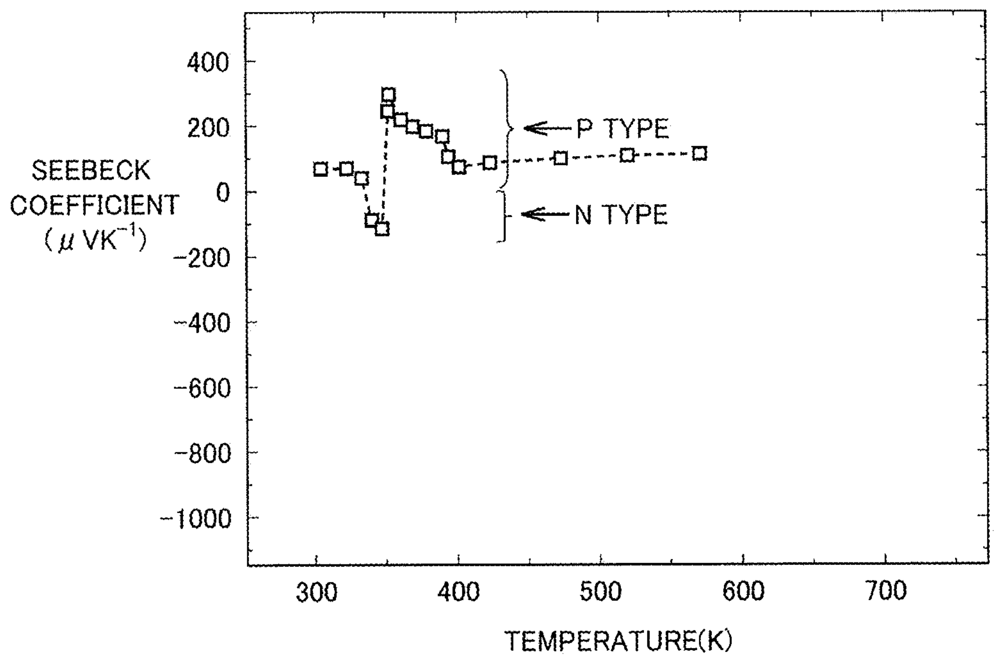
FIG. 7 is a graph showing a relationship between Seebeck coefficient α and temperature of a thermoelectric conversion material portion included in a thermoelectric conversion element in Embodiment 2.

FIG. 7 is a graph showing a relationship between Seebeck coefficient α and temperature of the thermoelectric conversion material portion included in the thermoelectric conversion element in Embodiment 2. In FIG. 7, the horizontal axis represents temperature (K) and the vertical axis represents Seebeck coefficient ($\mu VK^{-1}$).

Referring to FIG. 7, as the thermoelectric conversion material portion is increased in temperature, the Seebeck coefficient α once decreases significantly from a positive value to a negative value at around 325 K to 345 K. Thereafter, with a temperature rise, the Seebeck coefficient increases significantly from a negative value to a positive value.

At the temperature at which the Seebeck coefficient changes from a positive value to a negative value, and at the temperature at which the Seebeck coefficient changes from a negative value to a positive value, the compound semiconductor constituting the thermoelectric conversion material portion undergoes changes in conductivity type. Thus, the thermoelectric conversion element in Embodiment 2 is a thermoelectric conversion element that, when being used in a temperature range in which the temperature at the boundary changes, allows the conductivity type of the compound semiconductor constituting the thermoelectric conversion material portion to be changed depending on the temperature range in which the element is used.

In the thermoelectric conversion element in Embodiment 2, the value of c is greater than 0 and smaller than 0.143. That is, there is a relationship of $0<c<0.143$ for the value of c described above. Specifically, a compound semiconductor having the ratio of the base material elements in the range of $Cu_{65.00}Se_{35.00}$ to $Cu_{66.67}Se_{33.33}$ is adopted. Such a thermoelectric conversion element can more reliably allow the conductivity type of the compound semiconductor constituting the thermoelectric conversion material portion to be changed. That is, with such a configuration, the thermoelectric conversion element described above can be obtained more reliably.

Embodiment 3

Yet another embodiment, Embodiment 3, will now be described. The thermoelectric conversion element of Embodiment 3 differs from that of Embodiment 1 in that Ag is selected as the first base material element A and S is selected as the second base material element B in the thermoelectric conversion material portion. In the thermoelectric conversion element in Embodiment 3, the first base material element is Ag. The second base material element is S. The compound $A_xB_y$ according to the stoichiometric ratio is $Ag_2S$. The value of c is greater than 0 and smaller than 0.002.

Figure 8:
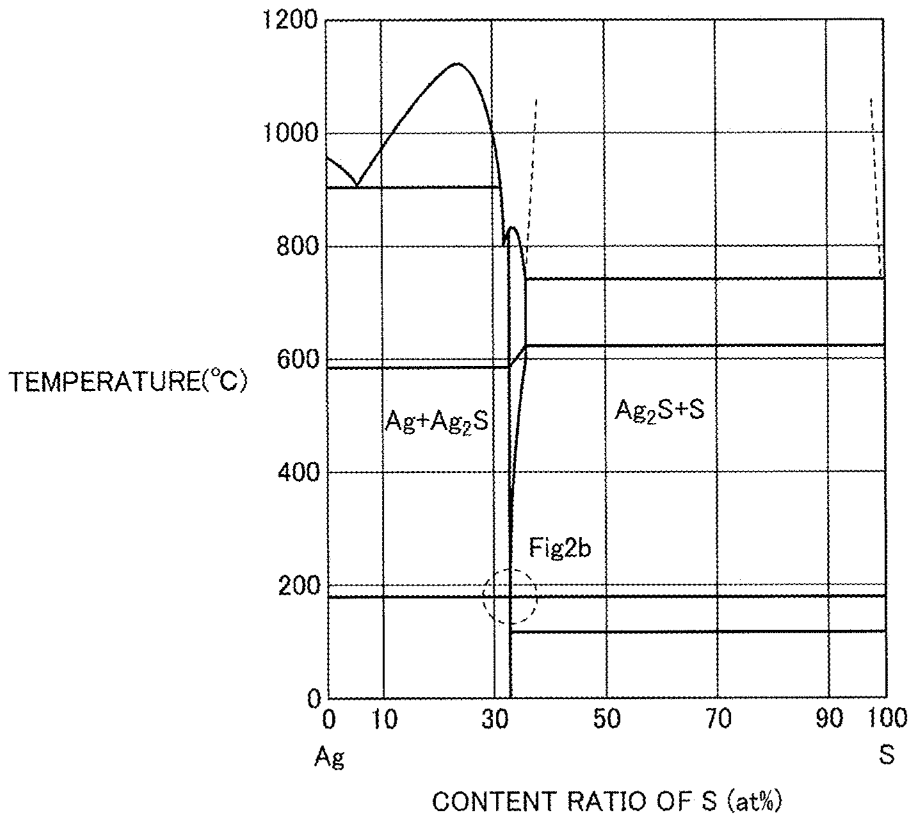
FIG. 8 is an Ag—S phase diagram.
Figure 9:
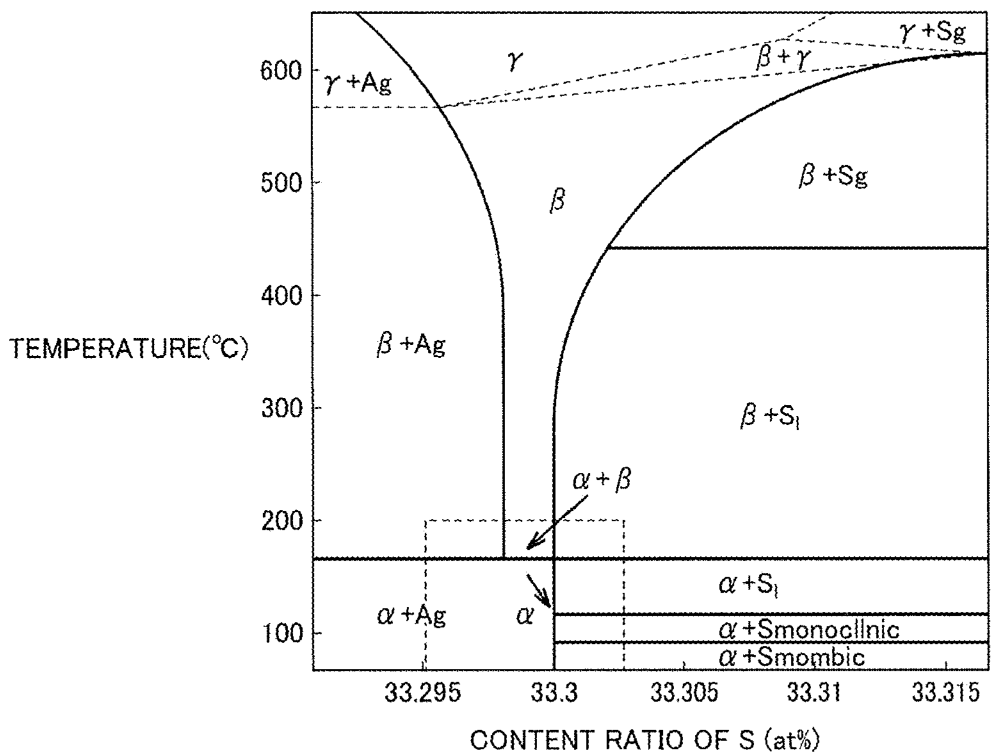
FIG. 9 is an enlarged view of a portion of the Ag—S phase diagram.
Figure 10:
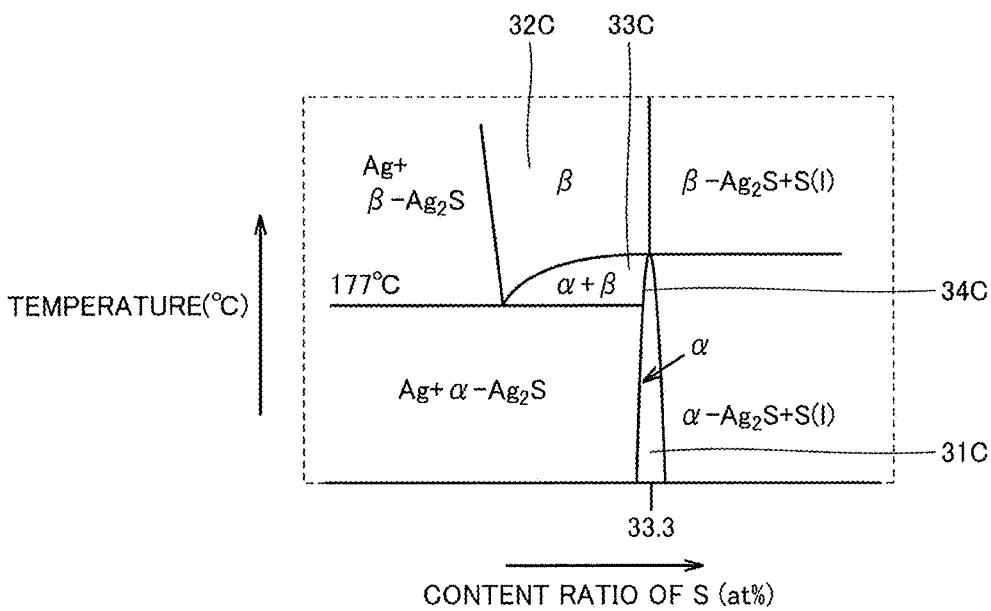
FIG. 10 is an enlarged view of a portion of the Ag—S phase diagram.

FIG. 8 is an Ag—S phase diagram. FIGS. 9 and 10 are enlarged views of portions of the Ag—S phase diagram. FIG. 9 is an enlarged view of the region delimited by the dashed line in FIG. 8. FIG. 10 is an enlarged view of the region delimited by the dashed line in FIG. 9. In FIGS. 8, 9 and 10, the horizontal axis represents content ratio of S (at %) and the vertical axis represents temperature (° C.).

Referring to FIGS. 8, 9, and 10, for the compound semiconductor constituting the thermoelectric conversion material portion included in the thermoelectric conversion element in Embodiment 3, a low temperature phase, a high temperature phase, and a coexisting phase are shown in the Ag—S phase diagram. That is, the Ag—S phase diagram includes a first region 31C corresponding to the low temperature phase, a second region 32C corresponding to the high temperature phase, and a third region 33C corresponding to the coexisting phase, sandwiched between the low temperature phase and the high temperature phase, in which the low and high temperature phases coexist (see particularly FIG. 10). As shown in FIGS. 9 and 10, a boundary 34C between the first region 31C and the third region 33C is inclined. In the present embodiment, the temperature at the boundary 34C between the first region 31C and the third region 33C changes monotonically with a change in c. Specifically, as c becomes greater, i.e., as the content ratio of S becomes smaller, the temperature at the boundary 34B becomes lower. A boundary 35C between the second region 32C and the third region 33C is also inclined.

Here, the I type thermoelectric conversion element shown in Embodiment 3 is used in a temperature range in which the temperature at the boundary 34C changes. Specifically, the element is used in the temperature range in which the temperature at the boundary 34C changes with the change in c.

Such a thermoelectric conversion element in Embodiment 3 is a thermoelectric conversion element that, when being used in a temperature range in which the temperature at the boundary changes, allows the conductivity type of the compound semiconductor constituting the thermoelectric conversion material portion to be changed depending on the temperature range in which the element is used.

In the thermoelectric conversion element in Embodiment 3, the value of c is greater than 0 and smaller than 0.002. That is, there is a relationship of $0<c<0.002$ for the value of c described above. Specifically, a compound semiconductor having the ratio of the base material elements in the range of $Ag_{67.002}S_{32.998}$ to $Ag_{66.667}S_{33.333}$ is adopted. Such a thermoelectric conversion element can more reliably allow the conductivity type of the compound semiconductor constituting the thermoelectric conversion material portion to be changed. That is, with such a configuration, the thermoelectric conversion element described above can be obtained more reliably.

Embodiment 4

Yet another embodiment, Embodiment 4, will now be described. The thermoelectric conversion element of Embodiment 4 differs from that of Embodiment 1 in that Te is selected as the second base material element B in the thermoelectric conversion material portion. In the thermoelectric conversion element in Embodiment 4, the first base material element is Cu. The second base material element is Te. The compound $A_xB_y$ according to the stoichiometric ratio is $Cu_2Te$. The value of c is greater than 0.02 and smaller than 0.22.

Figure 11:
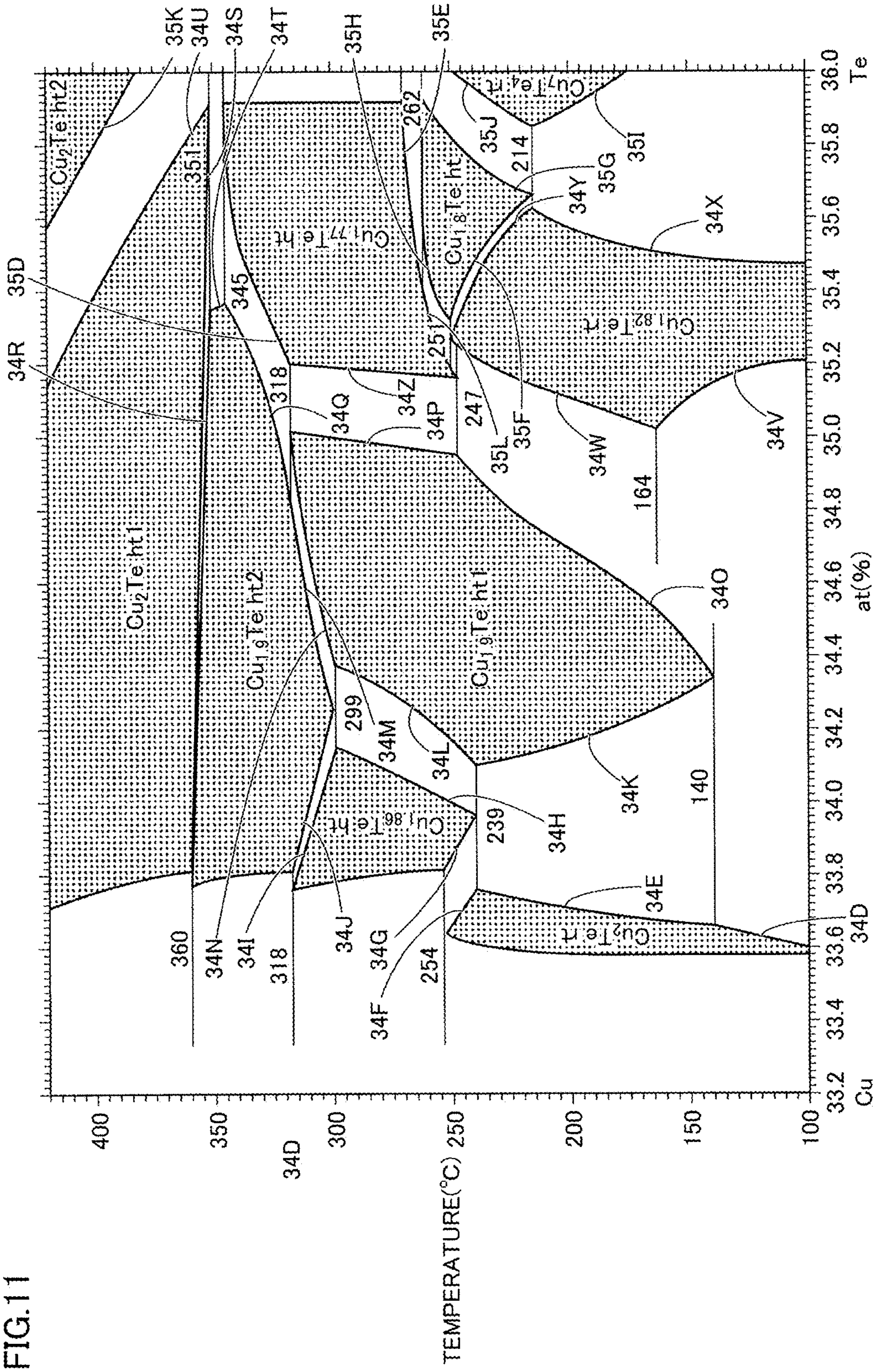
FIG. 11 is an enlarged view of a portion of a Cu—Te phase diagram.

FIG. 11 shows, in an enlarged view, a portion of a Cu—Te phase diagram. In FIG. 11, the horizontal axis represents content ratio of Te (at %) and the vertical axis represents temperature (° C.).

Referring to FIG. 11, for the compound semiconductor constituting the thermoelectric conversion material portion included in the thermoelectric conversion element in Embodiment 4, a low temperature phase, a high temperature phase, and a coexisting phase are shown in the Cu—Te phase diagram. That is, the Cu—Te phase diagram includes a first region corresponding to the low temperature phase, a second region corresponding to the high temperature phase, and a third region corresponding to the coexisting phase, sandwiched between the low temperature phase and the high temperature phase, in which the low and high temperature phases coexist. As shown in FIG. 11, boundaries 34D, 34E, 34F, 34G, 34H, 34I, 34J, 34K, 34L, 34M, 34N, 34O, 34P, 34Q, 34R, 34S, 34T, 34U, 34V, 34W, 34X, 34Y, 34Z, 35D, 35E, 35F, 35G, 35H, 35I, 35J, 35K, and 35L between the first region and the third region are inclined. In the present embodiment, at the boundaries 34D, 34E, 34F, 34G, 34H, 34I, 34J, 34K, 34L, 34M, 34N, 34O, 34P, 34Q, 34R, 34S, 34T, 34U, 34V, 34W, 34X, 34Y, 34Z, 35D, 35E, 35F, 35G, 35H, 35I, 35J, 35K, and 35L between the first region and the third region, the temperature changes monotonically with a change in c.

Here, the I type thermoelectric conversion element shown in Embodiment 4 is used in a temperature range in which the temperature at the boundaries 34D, 34E, 34F, 34G, 34H, 34I, 34J, 34K, 34L, 34M, 34N, 34O, 34P, 34Q, 34R, 34S, 34T, 34U, 34V, 34W, 34X, 34Y, 34Z, 35D, 35E, 35F, 35G, 35H, 35I, 35J, 35K, and 35L changes. Specifically, the element is used in the temperature range in which the temperature at the boundaries 34D, 34E, 34F, 34G, 34H, 34I, 34J, 34K, 34L, 34M, 34N, 34O, 34P, 34Q, 34R, 34S, 34T, 34U, 34V, 34W, 34X, 34Y, 34Z, 35D, 35E, 35F, 35G, 35H, 35I, 35J, 35K, and 35L changes with the change in c.

Such a thermoelectric conversion element in Embodiment 4 is a thermoelectric conversion element that, when being used in a temperature range in which the temperature at the boundary changes, allows the conductivity type of the compound semiconductor constituting the thermoelectric conversion material portion to be changed depending on the temperature range in which the element is used.

In the thermoelectric conversion element in Embodiment 4, the value of c is greater than 0.02 and smaller than 0.22. That is, there is a relationship of $0.02<c<0.22$ for the value of c described above. Specifically, a compound semiconductor having the ratio of the base material elements in the range of $Cu_{66.4}Te_{33.6}$ to $Cu_{64.0}Te_{36.0}$ is adopted. Such a thermoelectric conversion element can more reliably allow the conductivity type of the compound semiconductor constituting the thermoelectric conversion material portion to be changed. That is, with such a configuration, the thermoelectric conversion element described above can be obtained more reliably.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS

11 thermoelectric conversion element
12 thermoelectric conversion material portion
13 metal wire
14 high temperature side electrode
15 first low temperature side electrode (low temperature side electrode)
16 second low temperature side electrode (low temperature side electrode)
17 wire
21, 22, 23, 24 end
31A, 31B, 31C first region
32A, 32B, 32C second region
33A, 33B, 33C third region
34A, 34B, 34C, 34D, 34E, 34F, 34G, 34H, 34I, 34J, 34K, 34L, 34M, 34N, 34O, 34P, 34Q, 34R, 34S, 34T, 34U, 34V, 34W, 34X, 34Y, 34Z, 35A, 35B, 35C, 35D, 35E, 35F, 35G, 35H, 35I, 35J, 35K, 35L boundary
41A, 42A, 43B point

The invention claimed is:

1. A thermoelectric conversion element converting heat into electricity, comprising:

a thermoelectric conversion material portion constituted of a compound semiconductor that is composed of a first base material element A and a second base material element B and is represented by $A_{x-c}B_y$ with a value of x being smaller by c with respect to a compound $A_xB_y$ according to a stoichiometric ratio;

a first electrode disposed in contact with the thermoelectric conversion material portion; and a second electrode disposed in contact with the thermoelectric conversion material portion and apart from the first electrode;

an A-B phase diagram including a first region corresponding to a low temperature phase, a second region corresponding to a high temperature phase, and a third region corresponding to a coexisting phase, sandwiched between the low temperature phase and the high temperature phase, in which the low and high temperature phases coexist, a temperature at a boundary between the first region and the third region changing monotonically with a change in c.

2. The thermoelectric conversion element according to claim 1, wherein the compound semiconductor is a chalcogen compound.

3. The thermoelectric conversion element according to claim 1, wherein the first base material element is Cu, the second base material element is S, the compound $A_xB_y$ according to the stoichiometric ratio is $Cu_2S$, and the value of c is greater than 0 and smaller than 0.01.

4. The thermoelectric conversion element according to claim 1, wherein the first base material element is Cu, the second base material element is Se, the compound $A_xB_y$ according to the stoichiometric ratio is $Cu_2Se$, and the value of c is greater than 0 and smaller than 0.143.

5. The thermoelectric conversion element according to claim 1, wherein the first base material element is Ag, the second base material element is S, the compound $A_xB_y$ according to the stoichiometric ratio is $Ag_2S$, and the value of c is greater than 0 and smaller than 0.002.

6. The thermoelectric conversion element according to claim 1, wherein the first base material element is Cu, the second base material element is Te, the compound $A_xB_y$ according to the stoichiometric ratio is $Cu_2Te$, and the value of c is greater than 0.02 and smaller than 0.22.

* * * * *